(12) United States Patent
Papaliolios (10) Patent No.: US 6,236,245 B1
(45) Date of Patent: May 22, 2001

(54) OUTPUT PRE-DRIVER FOR REDUCING TOTEM POLE CURRENT

(75) Inventor: Andreas Papaliolios, Sunnyvale, CA (US)

(73) Assignee: Triscend Corporation, Mountain View, CA (US)

( * ) Notice: Subject to any disclaimer, the term of this patent is extended or adjusted under 35 U.S.C. 154(b) by 0 days.

(21) Appl. No.: 09/330,394

(22) Filed: Jun. 11, 1999

(51) Int. Cl.[7] ........................................... H03B 1/00
(52) U.S. Cl. .................. 327/108; 327/112; 327/403; 327/408; 326/82; 326/87
(58) Field of Search .................. 326/17, 21, 27, 326/82, 87; 327/108, 109, 112, 403, 404, 407–410, 374–377

(56) References Cited

U.S. PATENT DOCUMENTS

| | | | |
|---|---|---|---|
| 4,825,101 | * 4/1989 | Walters, Jr. | 326/27 |
| 4,910,416 | * 3/1990 | Salcone | 327/339 |
| 4,961,010 | 10/1990 | Davis | 326/27 |
| 5,450,019 | * 9/1995 | McClure et al. | 326/27 |
| 5,471,150 | * 11/1995 | Jung et al. | 326/27 |
| 5,486,782 | 1/1996 | Chan | 327/112 |
| 5,949,269 | * 9/1999 | Allen | 327/285 |

* cited by examiner

Primary Examiner—Timothy P. Callahan
Assistant Examiner—An T. Luu
(74) Attorney, Agent, or Firm—Blakely, Sokoloff, Taylor & Zafman LLP (57) ABSTRACT

An output driver to reduce totem pole current is provided. The output driver comprises a first delay element outputting a delayed first driver signal, and a first selection unit receiving as an input the first driver signal and the delayed first driver signal. The output driver further comprises a second delay element outputting a delayed second driver signal and a second selection unit receiving as an input the second driver signal and the delayed second driver signal. A selection signal for the first selector is the first driver signal, and the selection signal for the second selector is an inverted first driver signal, such that a path that is not presently driving is switched off first, prior to the opposing driver being turned on.

20 Claims, 8 Drawing Sheets

OUTPUT PRE-DRIVER FOR REDUCING TOTEM POLE CURRENT

FIELD OF THE INVENTION

The present invention relates to output buffers, and more specifically, to an output driver for reducing totem pole current.

BACKGROUND

A totem pole output is one that is connected through active devices to both sides of the circuit's power supply. Only one of the active devices can be biased on at any given time. When one is on, it effectively connects the output directly to the positive side of the power supply; when the other is on the output is connected directly to the negative side of the supply.

The advantage of totem pole outputs is that they have very low output impedance at both high and low output levels. This results in good noise immunity and the capability for high-speed operation.

A typical output circuit has a NPN transistor with its emitter connected to ground and its collector connected to the positive side of the power supply through a load resistor. When the transistor is biased on, the output is a low impedance to ground just as in the case of the totem pole output. However, when the transistor is biased off, the load resistor is a significant impedance across which noise voltages can be developed. Also, when driving a capacitive load, the load resistor, along with the load, has a time constant which increases the time for the output voltage to build up to its maximum level.

Figure 1:
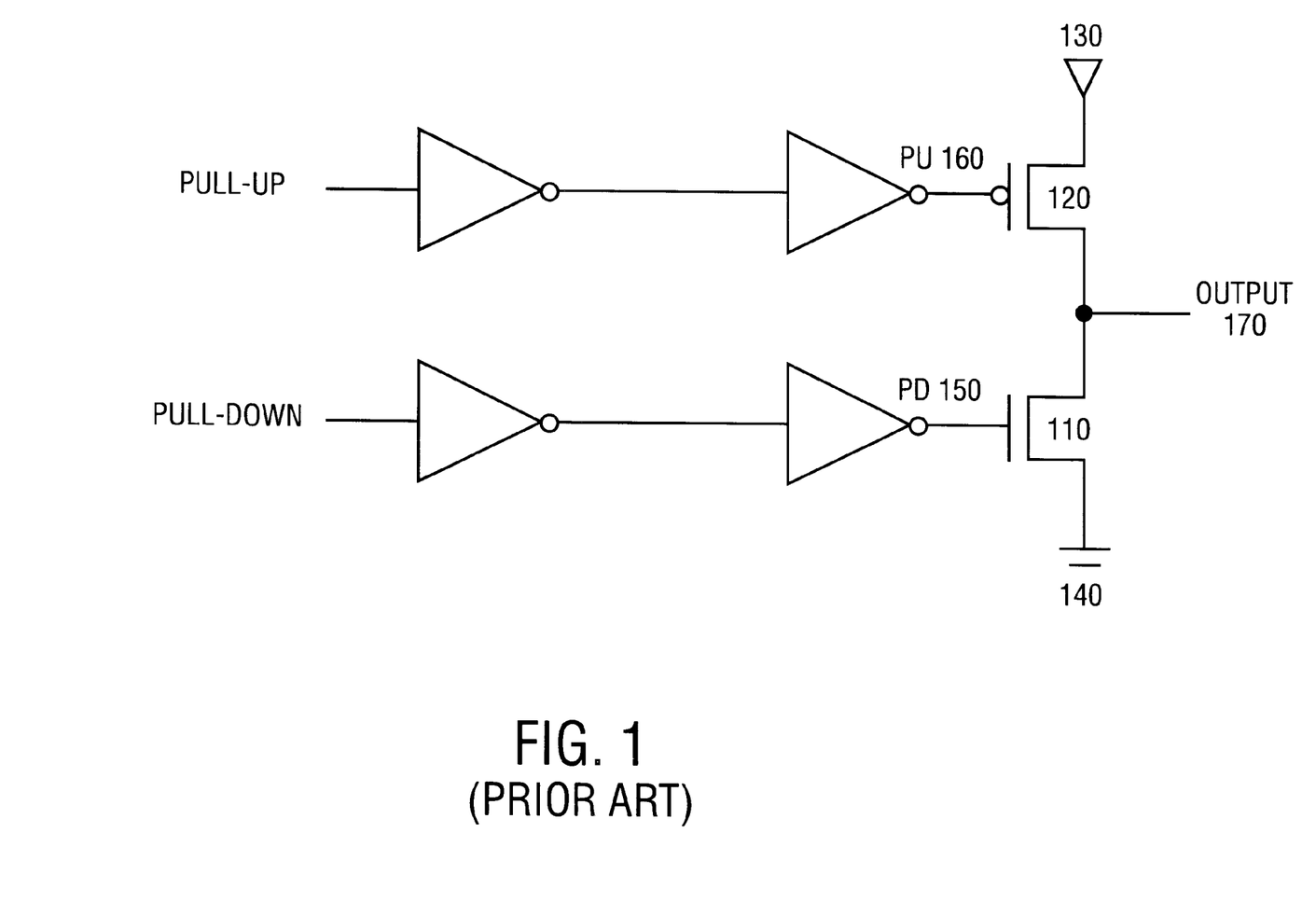
FIG. 1 is a circuit diagram of a prior art output driver.

FIG. 1 is a prior art buffer having a totem pole output. The buffer includes an N-type metal oxide semiconductor (NMOS) and a P-type MOS (PMOS) 120 coupled in series between $V_{cc}$ 130, the voltage supply, and ground 140. The output is coupled between the NMOS 110 and PMOS 120. The gate of the PMOS 120 receives the pull-up signal 150, while the gate of the NMOS 110 receives the pull-down signal 160. Thus, when the buffer is switched from a pull-up to a pull-down, the PMOS 120 is turned off while the NMOS 110 is turned on. Because it takes some time for the PMOS 120 or NMOS 110 to fully turn off, there is a period when both devices are partially on, and this causes a totem pole current.

Figure 2:
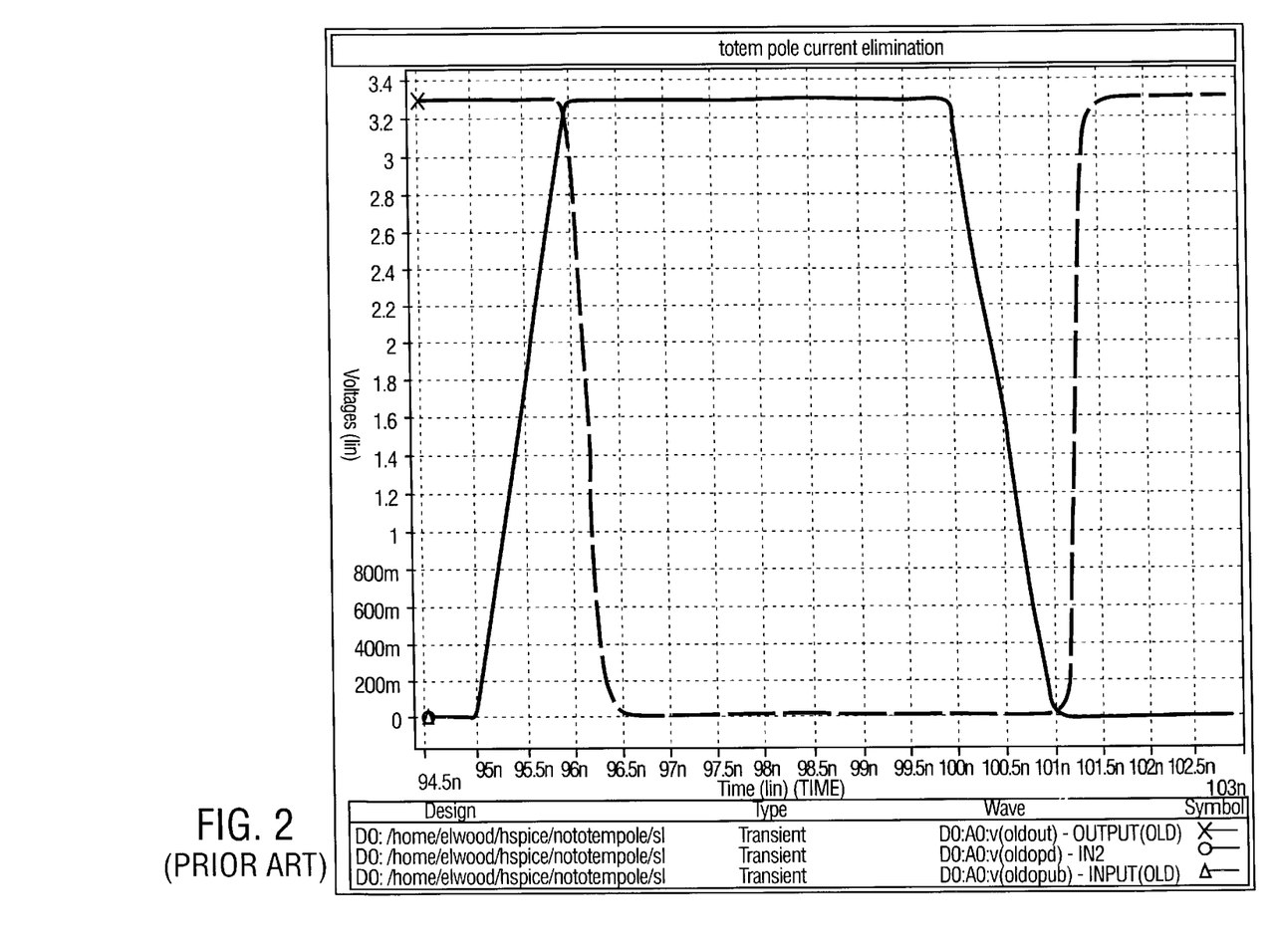
FIG. 2 is a waveform diagram of the current response of the inputs to the prior art driver of FIG. 1.

FIG. 2 illustrates the pull-up signal 210 and pull-down signal 220 for the circuit of FIG. 1. As can be seen from FIG. 2, there is a period when both the NMOS and PMOS are partially on, $t_{overlap}$ 230, i.e. the gate input to the NMOS is above the threshold voltage, while the gate input to the PMOS is below the threshold voltage. This overlapping period 230 produces a totem pole current. This may result in ground bounce. Ground bounce occurs when the chip ground moves up and down with respect to the PC-board and system ground. This changes the output Low voltage and changes the apparent input voltage, effectively adding to or subtracting from the input threshold voltage. This is disadvantageous because it may cause a false reading, and it increases power consumption. Therefore, it would be advantageous to have an output buffer that did not produce a totem pole current.

SUMMARY OF THE INVENTION

An output driver to reduce totem pole current is described. The output driver comprises a first delay element outputting a delayed first driver signal, and a first selection unit receiving as an input the first driver signal and the delayed first driver signal. The output driver further comprises a second delay element outputting a delayed second driver signal and a second selection unit receiving as an input the second driver signal and the delayed second driver signal. A selection signal for the first selector is the first driver signal, and the selection signal for the second selector is an inverted first driver signal, such that a path that is not presently driving is switched off first, prior to the opposing driver being turned on.

DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION

An output driver for reducing totem pole current is described. Totem pole current is the current generated when both the pull-up and pull-down drivers are partially on. By introducing a delay in turning on the driver that is not currently driving, the totem pole current is reduced, resulting a reduction of ground bounce, and therefore in lower power consumption and higher noise immunity.

Figure 4:
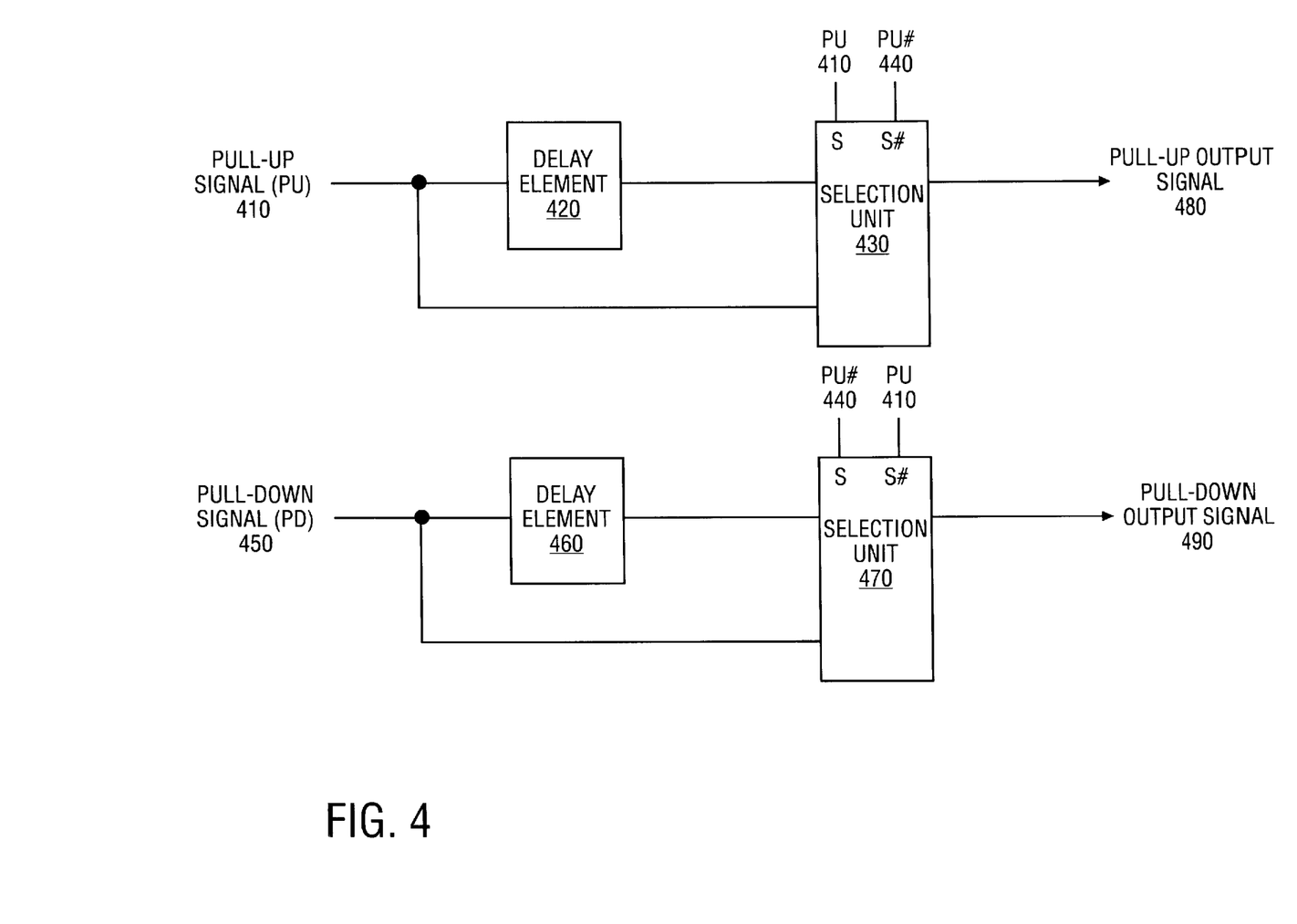
FIG. 4 is a block diagram of one embodiment of an output pre-driver.

FIG. 4 is a block diagram of one embodiment of the output pre-driver. The pull-up signal 410 is input to a delay element 420. The output of the delay element 420 is input to a selection unit 430. The pull-up signal 410 is also directly connected to the selection unit 430. The selection unit 430 selects either the pull-up signal 410 or the delayed pull-up signal, based on the selection input, pull-up signal (PU) 410. For one embodiment, the selection unit 430 uses complimentary metal oxide semiconductor (CMOS) technology, the inverse of the pull-up signal 410, PU#440, is also input to the selection unit 430. The output of the selection unit 430 is pull-up output signal (FUOS) 480. This output 480 is an input to a driver (not shown).

Similarly, for the pull-down signal 450, a selection unit 470 has as an input the pull-down signal (PD) 450, and the pull-down signal delayed by the delay element 460, PD#. The PD signal 450 or delayed PD signal is selected by selection signal PU# 440. If the selection unit 470 uses CMOS technology, the pull-signal 410 is also input to selection unit 470. The output of the selection unit 470 is the pull-down output signal (PDOS) 490. This output 490 is an input to a driver.

Together, the delay elements 420, 460 and selection units 430, 470 form a pre-driver. The output of the pre-driver is input to an output driver. If the pull-up signal 410 is initially low, i.e. active, the selection unit 430 is selecting the pull-up signal 410. Therefore, the PUOS signal 480 is also active, and not delayed.

When the pull-up signal stops being active, i.e. is pulled high, the selection unit 430 stops selecting the PU signal 410, and starts selecting the delayed PU signal. The selection unit 430 selects the delayed PD signal 450. Thus, during the period of time when the PUOS signal 480 has not been completely turned off, the PDOS signal 490 is delayed by delay unit 460. This eliminates the overlap between the PDOS signal 490 and PUOS signal 480, and thus eliminates any totem pole current.

Figure 5:
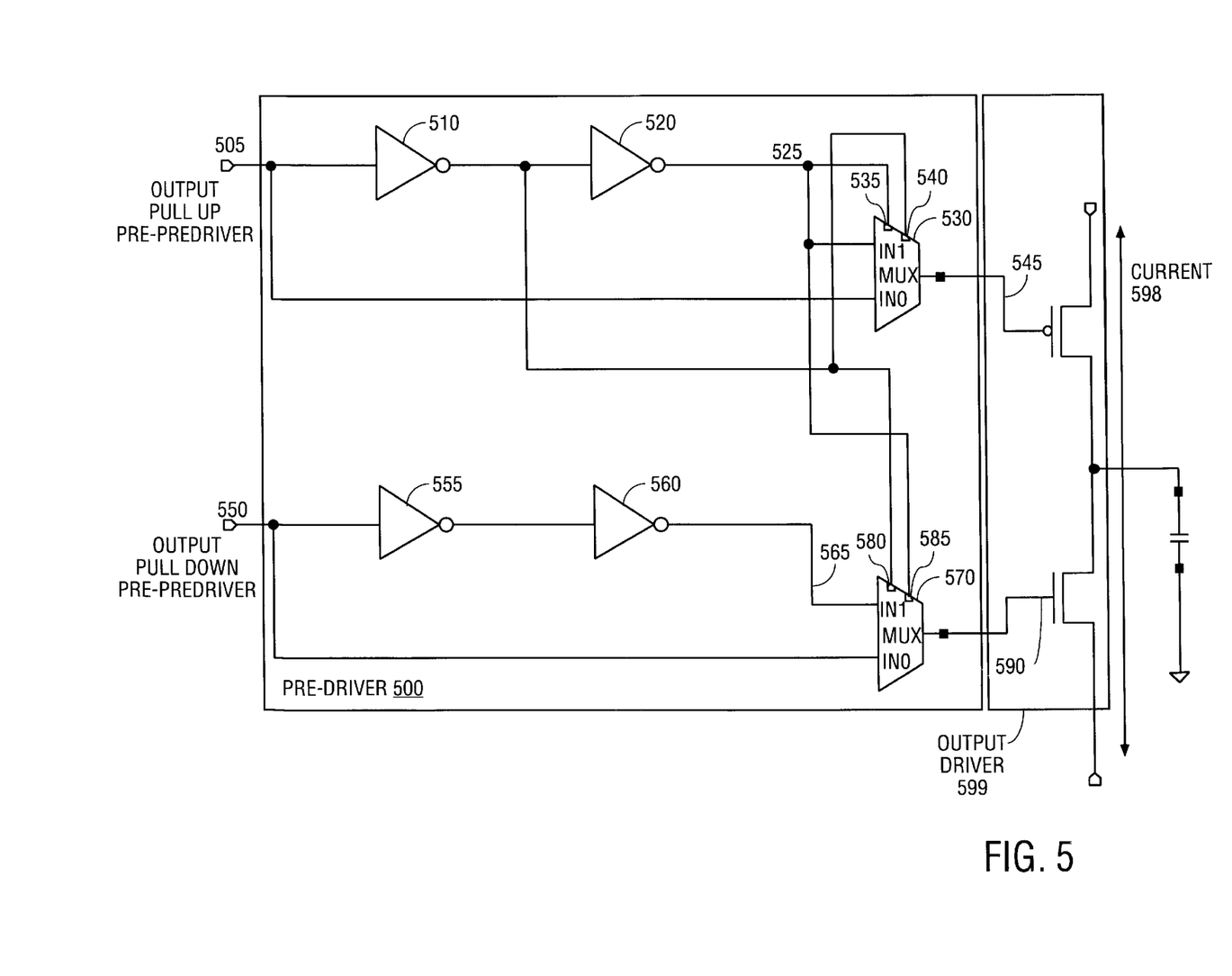
FIG. 5 is a circuit diagram of one embodiment of the output pre-driver and output driver.

FIG. 5 is a circuit diagram of one embodiment of the output pre-driver and output driver. The pull-up signal 505 is coupled as one input to a multiplexer 530. The pull-up signal 505 is also coupled to two inverters 510, 515 in series. The output of the two inverters 510, 515 is a delayed pull-up signal (DPU) 525. The DPU signal 525 is another input to the multiplexer 530. The selector (s) 535 of multiplexer 530 is the DPU signal 525.

For one embodiment, the multiplexer 530 is a CMOS multiplexer. In that instance, the inverter selector (s#) 540 of multiplexer 530 is the output of inverter 510. The output of multiplexer 530 is the driven pull-up signal 545.

Similarly, the pull-down signal 550 is coupled as one input to a second multiplexer 570. The pull-down signal 550 is also coupled to two inverters 555, 560 coupled in series. The output of the two inverters 555, 560 is the delayed pull-down signal (DPD) 565. The DPD signal 565 is another input to the multiplexer 570. The selector (s) 580 of multiplexer 570 is the output of inverter 510. The inverter selector (s#) 585 of multiplexer 570 is the delayed pull-up signal (DPU) 525. The output of multiplexer 570 is the driver pull-down signal 590.

The inverters 510, 520, 555, 560 and MUXes 530, 570 form a pre-driver 500. The outputs 545, 590 of pre-driver 500 are input to driver 599.

For one embodiment, the inverter pairs 510, and 555, 560 are matched in size and delay time. For one embodiment, the first inverters 510, 555 in each inverter pair have a longer delay than the second inverters 515, 560. For another embodiment, the reverse may be true.

For one embodiment, the dimensions of inverter 510 are PMOS 1.7/0.8 and NMOS 0.8/0.08. For one embodiment, the dimensions of inverter 515 are PMOS 5.3/0.35 and NMOS 3.5/0.35. The dimensions of the inverter may define the delay. The delay may be selected to optimize between the cost of delay and maximum tolerable totem pole current. When the delay equals the switching time of the NMOS/PMOS, there is no totem pole current any additional delay serves no purpose. For one embodiment, the delay is between 0.5 and 1.5 nanoseconds.

For one embodiment, the delay of the second inverter 520 is smaller than the delay of the first inverter 510. Therefore, the inverter selector s# is not very delayed compared to the selector s. It should be understood that the actual dimensions of the inverters might be varied from the example presented above.

For one embodiment, the first inverter 555 in the pull-down signal series is matched to the first inverter 510 in the pull-up signal series. The second inverter 560 in the pull-down series is matched to the second inverter 515 in the pull-up series. In this way, the delayed pull-down signal 565 reaches the multiplexer 570 at approximately the same time as the delayed pull-up signal 530 reaches multiplexer 530.

Figure 6:
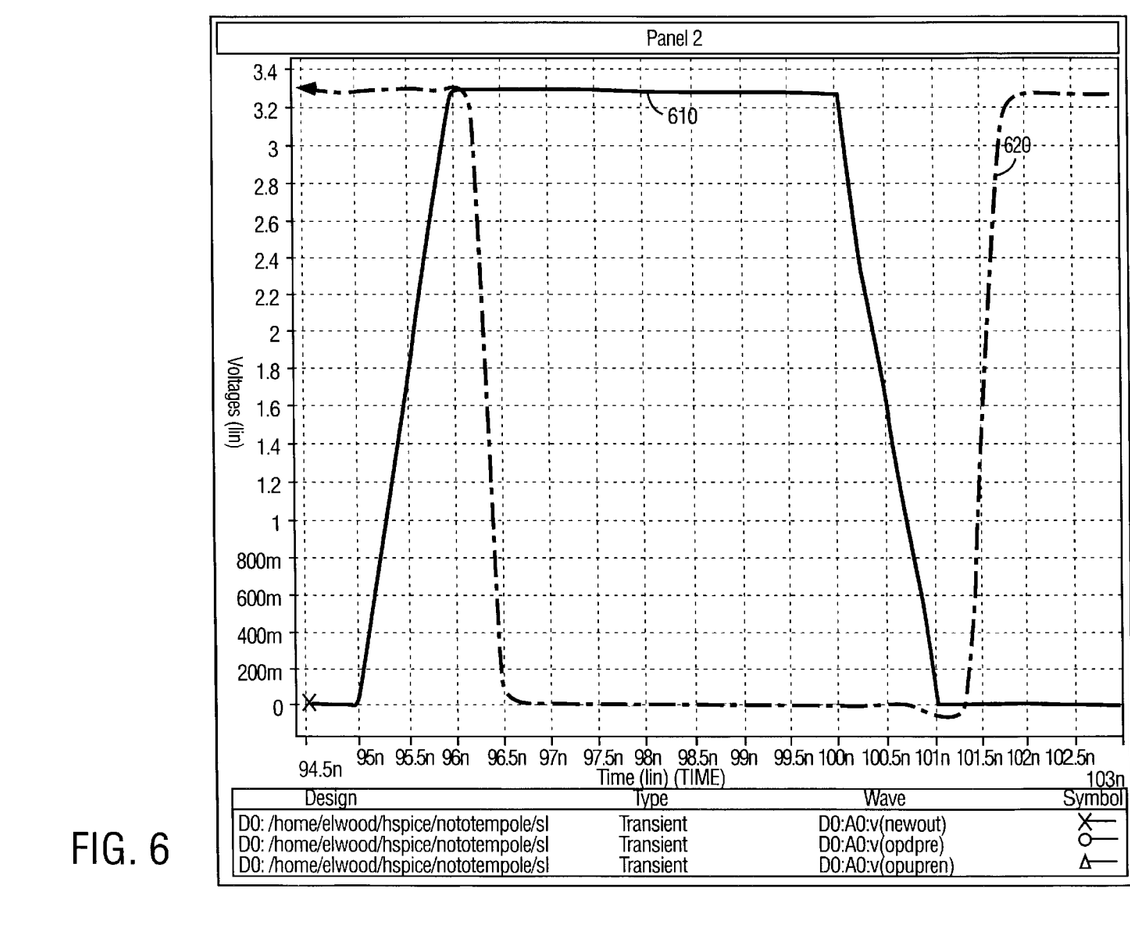
FIG. 6 is a waveform diagram of the pull-up voltage and pull-down voltage of the circuit of FIG. 5.

FIG. 6 is a waveform diagram of the pull-up voltage and pull-down voltage of the circuit of FIG. 5. As can be seen, the pull-down voltage 620 is delayed with respect to the pull-up voltage 610, allowing the pull down drives to be completely switched off before the pull-up drives is switched on.

Figure 3:
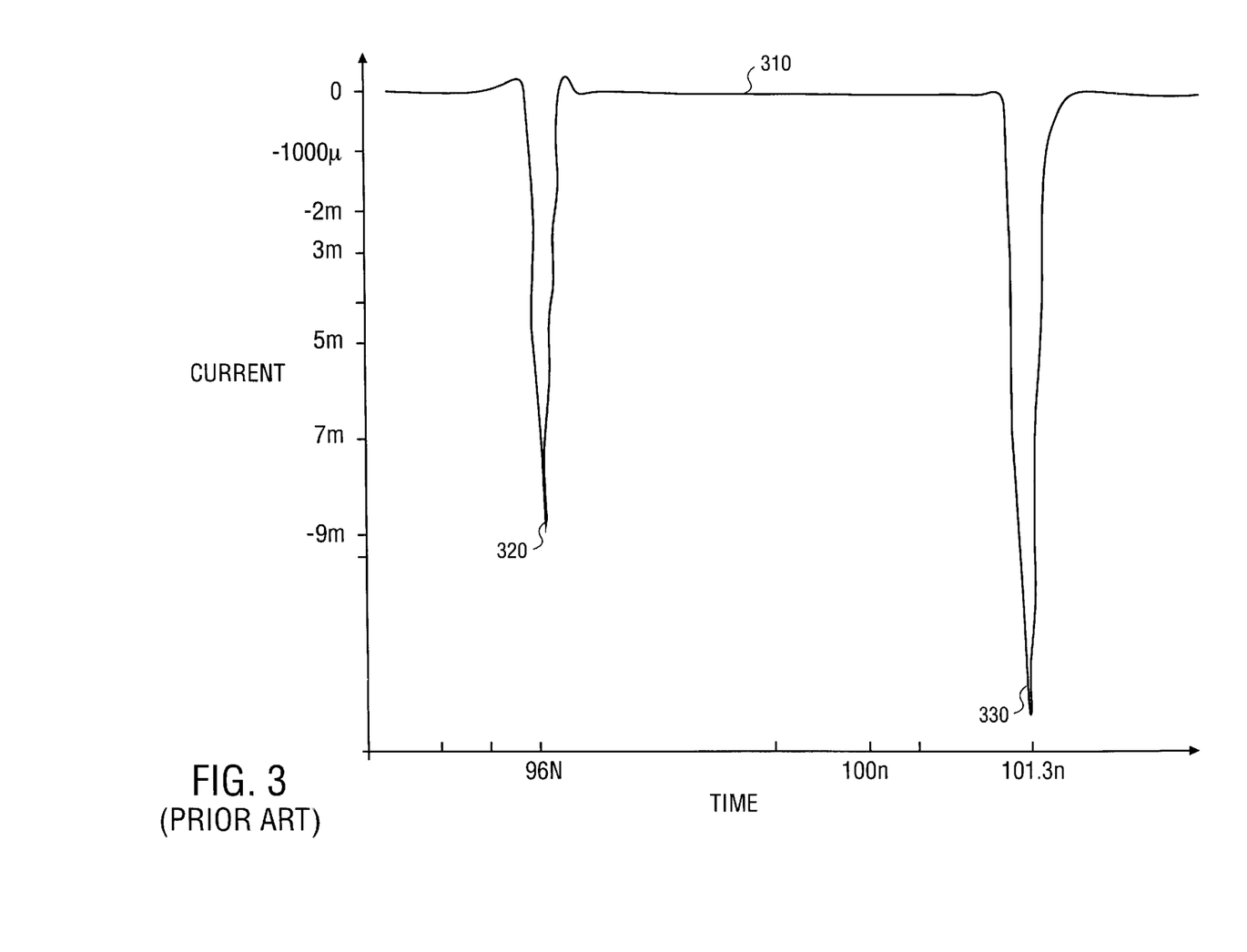
FIG. 3 is a waveform diagram of the current consumption of the outputs of the prior art pre-driver.
Figure 7:
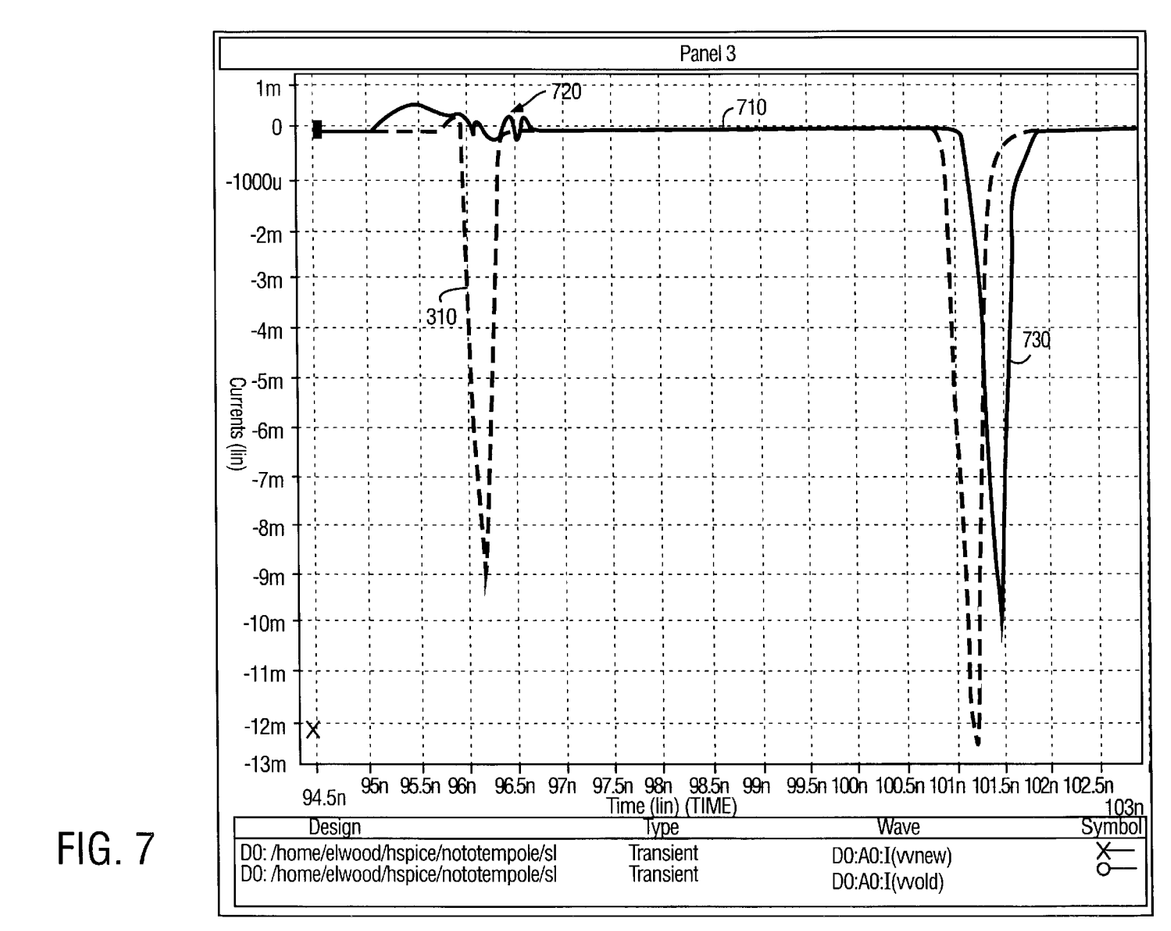
FIG. 7 is a waveform diagram of the transient current response of the pre-driver in FIG. 5.

FIG. 7 is a waveform diagram of the current response across the output, $V_{cc}$ to ground, shown as current response 598 in FIG. 5. The current response 710 is shown over 100+ nano-seconds. FIG. 7 includes, for comparison, a prior art current response 310. At the first transition 720, the current response exhibits virtually no transient spike from totem-pole current, unlike the prior art circuit. At the second transition 730, the prior art response 310 shows capacitive charging current and totem pole current transient response. The current response 710 includes capacitive drive/charge current, but does not show a totem pole current spike. This reduces the spike, in this example, from approximately 12.5 mA to 10 mA.

Figure 8:
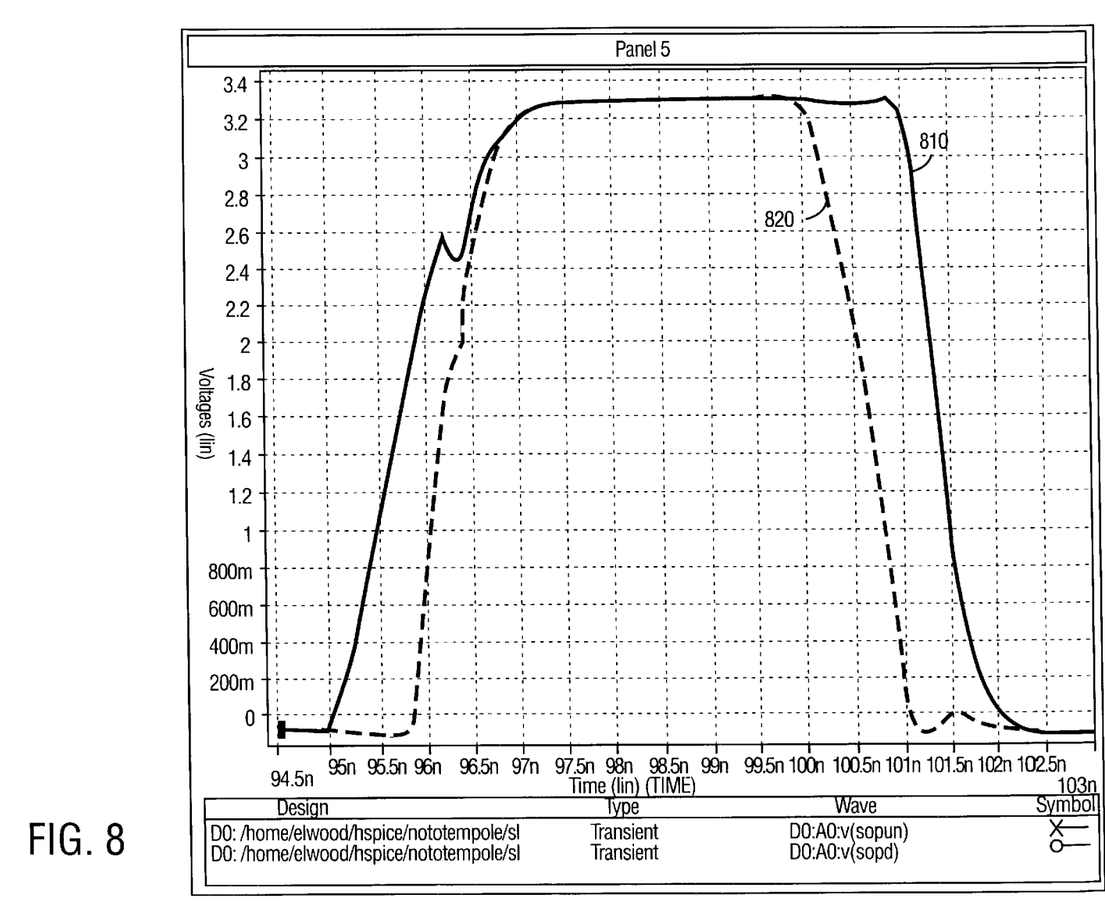
FIG. 8 is a waveform diagram of the voltage response of the output of the pre-driver of FIG. 5.

FIG. 8 is a waveform diagram of the voltage response of the outputs of the pre-driver 500. The pull-up signal 810 is delayed with respect to the pull-down signal 820. This delay of the output of the pre-driver circuit 500 avoids the totem pole current issues for circuits driven by the pre-driver circuit 500. By reducing the totem pole current, ground bounce is also reduced. This is advantageous, as described above.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. An output driver comprising:
    a first delay element outputting a delayed first driver signal;
    a first selection unit receiving as a first input a first driver signal and as a second input the delayed first driver signal; a second delay element outputting a delayed second driver signal;
    a second selection unit receiving as a first input a second driver signal and as a second input the delayed second driver signal;
    a selection signal for the first selection unit being the delayed first driver signal, and the selection signal for the second selection unit being an inverted first driver signal, such that a path that is not presently driving is switched off first, prior to the opposing driver being turned on.

2. The output driver of claim 1, wherein the first delay element comprises a first inverter and a second inverter in series.

3. The output driver of claim 1, wherein the second delay element comprises a first inverter and a second inverter in series.

4. The output driver of claim 3, wherein the inverters in the second delay element are matched to inverters in the first delay element.

5. The output driver of claim 2, wherein the first inverter has a longer delay than the second inverter.

6. The output driver of claim 2, wherein the first inverter and the second inverter comprise a PMOS (P-type Metal Oxide Semiconductor) and an NMOS (N-type metal oxide semiconductor).

7. The output driver of claim 1, wherein the first selection unit and the second selection unit are multiplexers.

8. The output driver of claim 7, wherein the multiplexers are complimentary metal oxide semiconductor (CMOS) multiplexers.

9. The output driver of claim 8, further comprising:
an inverted selector signal coupled to the first selection unit, the inverted selector signal comprising an inverted first driver signal; and
an inverted selector signal coupled to the second selection unit, the inverted selector signal comprising the first driver signal.

10. An output driver comprising:
a first inverter and second inverter in series, a first signal being an input to the first inverter, and an output of the second inverter being a first delayed signal;
a third inverter and a fourth inverter in series, a second signal being an input to the third inverter, and an output of the fourth inverter being a second delayed signal;
a first multiplexer having as a first input the first signal and as a second input the first delayed signal, the multiplexer selecting one of the first or first delayed signals as a first output; and
a second multiplexer having as a first input the second signal and as a second input the second delayed signal, the multiplexer selecting one of the second or second delayed signals as a second output; and
wherein a selection signal for the first multiplexer is the first delayed signal, and the selection signal for the second multiplexer is an output of the first inverter, which is an inverted first signal.

11. The output driver of claim 10, wherein the multiplexers are complimentary metal oxide semiconductor (CMOS) multiplexers.

12. The output driver of claim 11, wherein an inverted selection signal to the first multiplexer is the output of the first inverter, and wherein the inverted selection signal to the second multiplexer is the delayed first signal.

13. The output driver of claim 10, wherein the inverters are CMOS inverters.

14. The output driver of claim 10, wherein the first inverter and the third inverter are matched in size, and the second inverter and the fourth inverter are matched in size.

15. The output driver of claim 10, wherein the delay of the first delayed signal and the second delayed signal is between 0.25 and 1.5 nano-seconds.

16. The output driver of claim 15, wherein the delay of the first delayed signal and the second delayed signal is approximately 0.8 nano-seconds.

17. A method of reducing totem-pole current in a driver circuit, the method comprising:
receiving a first signal and a second signal;
generating a delayed first signal and a delayed second signal; recursively selecting as a first output signal the first signal or the delayed first signal, based on whether the first signal is a driving signal; and
recursively selecting as a second signal the second signal or the delayed second signal, based on whether the first signal is a driving signal.

18. The method of claim 17, wherein:
the first delayed signal is generated using a first delay element comprising a first inverter and a second inverter in series; and
the second delayed signal is generated using a second delay element that comprising a first inverter and a second inverter in series.

19. The method of claim 18, wherein the inverters in the second delay element are matched to inverters in the first delay element.

20. The method of claim 18, wherein the first inverter in the first delay element has a longer delay than the second inverter in the first delay element.

* * * * *